United States Patent
Liu et al.

(10) Patent No.: US 8,410,485 B2
(45) Date of Patent: Apr. 2, 2013

(54) PIXEL STRUCTURE

(75) Inventors: Chin-Chang Liu, Taichung County (TW); Chien-Ting Chan, Changhua County (TW); Kuo-Chang Su, Tainan County (TW)

(73) Assignee: Wintek Corporation, Taichung (TW)

( * ) Notice: Subject to any disclaimer, the term of this patent is extended or adjusted under 35 U.S.C. 154(b) by 32 days.

(21) Appl. No.: 13/080,664

(22) Filed: Apr. 6, 2011

(65) Prior Publication Data

US 2011/0241015 A1   Oct. 6, 2011

(30) Foreign Application Priority Data

Apr. 6, 2010  (TW) ............................... 99110570 A

(51) Int. Cl.
H01L 29/04 (2006.01)
(52) U.S. Cl. ............................ 257/62; 257/70; 349/46
(58) Field of Classification Search .................... 257/60, 257/72; 349/46, 48, 129, 139
See application file for complete search history.

(56) References Cited

U.S. PATENT DOCUMENTS

| 2004/0085272 A1* | 5/2004 | Ting et al. ................. 345/87 |
| 2007/0200989 A1* | 8/2007 | Shinichi et al. ............ 349/129 |
| 2009/0096734 A1* | 4/2009 | Huang et al. .............. 345/89 |
| 2009/0231505 A1* | 9/2009 | Wang et al. ............... 349/46 |
| 2011/0049521 A1* | 3/2011 | Chen et al. ............... 257/72 |

* cited by examiner

*Primary Examiner* — Howard Weiss
*Assistant Examiner* — Steven Rao
(74) *Attorney, Agent, or Firm* — Jianq Chyun IP Office

(57) ABSTRACT

A pixel structure including a scan line, a data line intersecting the scan line, a first gate, a second gate, a third gate, a semiconductor layer, a source, a first drain, a second drain, a first pixel electrode, and a second pixel electrode is provided. The dataline and the scan line are interlaced disposed. The semiconductor layer is disposed on the scan line to define the first gate and the second gate. The source is directly connected to the data line and located between the first gate and the second gate. The first gate is located between the first drain and the source. The second gate is located between the second drain and the source. The third gate is electrically connected to the scan line. The first pixel electrode and the second pixel electrode are respectively electrically connected to the first drain and the second drain.

9 Claims, 3 Drawing Sheets

PIXEL STRUCTURE

CROSS-REFERENCE TO RELATED APPLICATION

This application claims the priority benefit of Taiwan application serial no. 99110570, filed Apr. 6, 2010. The entirety of the above-mentioned patent application is hereby incorporated by reference herein and made a part of this specification.

BACKGROUND OF THE INVENTION

1. Field of the Invention

The invention relates to a pixel structure, and more particularly to a pixel structure having dual active devices.

2. Description of Related Art

Regarding to the current liquid crystal display (LCD), the technologies that have been developed to satisfy the requirement of wide viewing angle include: twisted nematic (TN) LCD equipped with wide viewing films, in-plane switching (IPS) LCD, fringe field switching (FFS) LCD and multi-domain vertically alignment (MVA) LCD. Taking the MVA-LCD as an example, since the alignment protrusions or slits formed on the color filter substrate or the thin film transistor (TFT) array substrate render the liquid crystal molecules arranged in multi-direction thereby obtaining a plurality of different aligned domains, the MVA-LCD meets the requirement of wide viewing angle.

Though the MVA-LCD facilitates the requirement of wide viewing angle through the design of multi-domains, the image brightness displayed by the MVA-LCD may not be uniformed if the viewing angle changes. Therefore, the problem such as color shift and the like is caused in the MVA-LCD. In order to solve the problem of color shift, several technologies have already been proposed one after the other. The technologies are mainly stands at the formation of different electric fields in two pixel electrodes of a single pixel unit. Accordingly, the liquid crystal molecules located above different pixel electrodes are arranged in different alignments to mitigate the color shift.

SUMMARY OF THE INVENTION

The invention directed to a pixel structure to solve the color shift problem in an MVA-LCD.

The invention provides a pixel structure including a scan line, a data line, a first gate, a second gate, a third gate, a semiconductor layer, a source, a first drain, a second drain, a first pixel electrode, and a second pixel electrode. The scan line has a mainline and a branch. The data line is intersected with the mainline. The semiconductor layer is disposed on the mainline and the branch to respectively define a first gate and a second gate. The source is directly connected to the data line. The source is disposed on the semiconductor layer and located between the first gate and the second gate. The first drain contacts the semiconductor layer, and the first gate is located between the first drain and the source. The second drain contacts the semiconductor layer, and the second gate is located between the second drain and the source. The third gate is electrically connected to the scan line. The first pixel electrode is electrically connected to the first drain. The second pixel electrode is electrically connected to the second drain.

In view of the above, the pixel structure of the invention is configured with two active devices, wherein one of the active devices has two gates so that the two active devices have different property. Accordingly, under a same driving signal, a single pixel can be provided with different voltages. Therefore, when the pixel structure of the invention is applied in an MVA-LCD, the problem of color shift is eliminated. In addition, the dual gates active device is manufactured by the conventional process so that the manufacturing process and the material cost are not increased in the invention.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
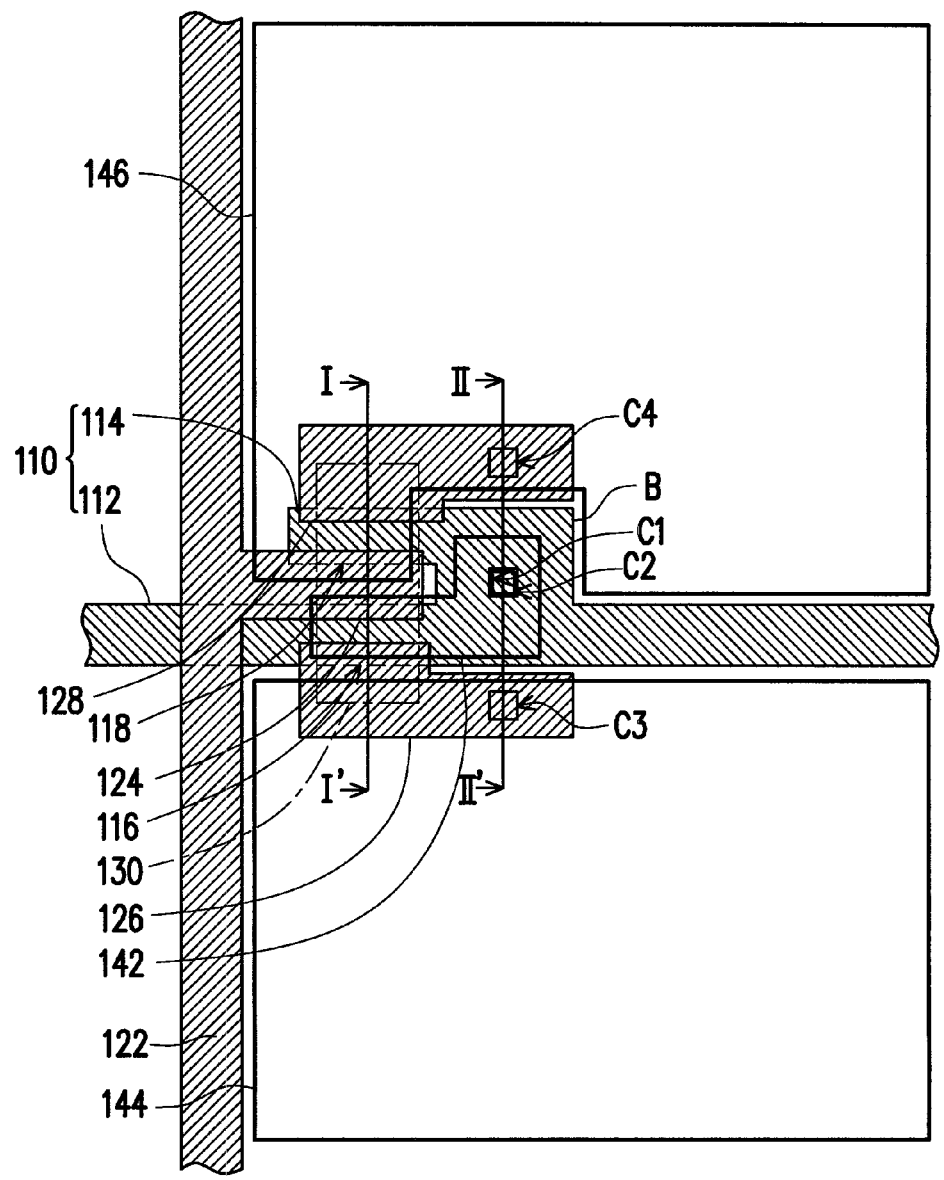
FIG. 1A illustrates a schematic top view of a pixel structure according to an embodiment of the invention.

FIG. 1A illustrates a schematic top view of a pixel structure according to an embodiment of the invention. Referring to FIG. 1A, a pixel structure 100 includes a scan line 110, a first gate 116, a second gate 118, a data line 122, a source 124, a first drain 126, a second drain 128, a semiconductor layer 130, a third gate 142, a first pixel electrode 144, and a second pixel electrode 146.

Particularly, the scan line 110 has a mainline 112 and a branch 114 substantially parallel to the mainline 112. The data line 122 is intersected with the mainline 112. The semiconductor layer 130 crosses over the mainline 112 and the branch 114 to respectively define the first gate 116 and the second gate 118. That is to say, the first gate 116 and the second gate 118 are the extension portions of the scan line 110. The first gate 116 is disposed between the first drain 126 and the source 124. The second gate 118 is disposed between the second drain 128 and the source 124. Specifically, the scan line 110 in the present embodiment has a protruding portion B connected between the branch 114 and the mainline 112 so that the first gate 116 and the second gate 118 are electrically connected. However, the scan line 116 is not restricted in the pattern design depicted herein. In other embodiments, the scan line 110 can have other pattern designs to define the corresponding first gate 116 and the corresponding second gate 118.

The source 124 is directly connected to the data line 122, and located between the first gate 116 and the second gate 118. The source 124 is an extension of the data line 122 and is exemplified located between the protruding portion B and the data line 120. Nevertheless, the pattern of the source 124 is not restricted and the pattern of the source 124 can be designed and modified based on different requirements in other embodiments. Moreover, the third gate 142 is located between the source 124 and the first drain 126. The first pixel electrode 144 and the second pixel electrode 146 are respectively located at two opposite sides of the mainline 112.

Figure 1B:
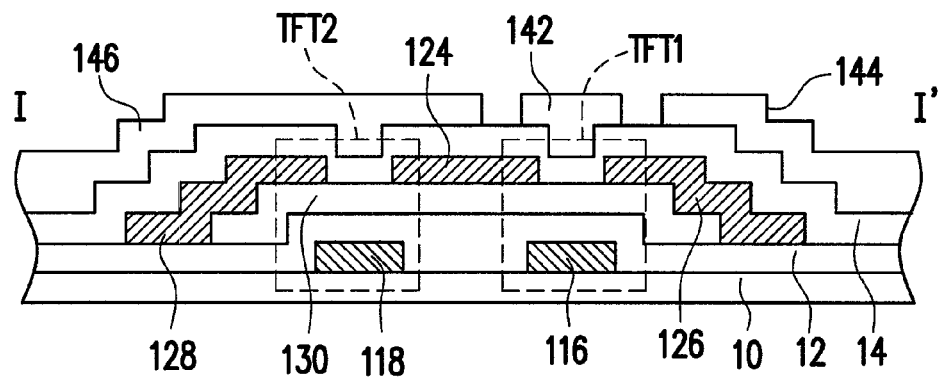
FIG. 1B is a cross-sectional view taken along a section line I-I' depicted in FIG. 1A.

FIG. 1B is a cross-sectional view taken along a section line I-I' depicted in FIG. 1A. Referring to FIG. 1B, the pixel structure 100 is formed by a plurality of film layers sequentially disposed on a substrate 10, wherein the film layers includes a first conductive layer (not shown), a first insulator layer 12, the semiconductor layer 130, a second conductive layer (not shown), a second insulator layer 14, and a third conductive layer (not shown) in sequence. The first conductive layer (not shown) forms the scan line 110, the first gate 116, and the second gate 118. The second conductive layer (not shown) forms the data line 122, the source 124, the first drain 126, and the second drain 128. In addition, the third conductive layer (not shown) forms the third gate 142, the first pixel electrode 144, and the second pixel electrode 146.

In the present embodiment, the third gate 142 is formed by one of the film layers most away from the substrate 10, and thus a part of the semiconductor layer 130 is sandwiched between the first gate 116 and the third gate 142 in the cross sectional view. It is noted that the third gate 142, the first pixel electrode 144, and the second pixel electrode 146 are formed by the same material such as a transparent conductive material or other conductive materials. Hence, no additional cost or manufacturing process is needed for facilitating the disposition of the third gate 142. In addition, the source 124, the first drain 126, and the second drain 128 all directly contact the semiconductor layer 130. Accordingly, the first gate 116, the third gate 142, the semiconductor layer 130, the source 124, and the first drain 126 form a first active device TFT1. The second gate 118, the semiconductor layer 130, the source 124, and the second drain 128 form a second active device TFT2.

Figure 1C:
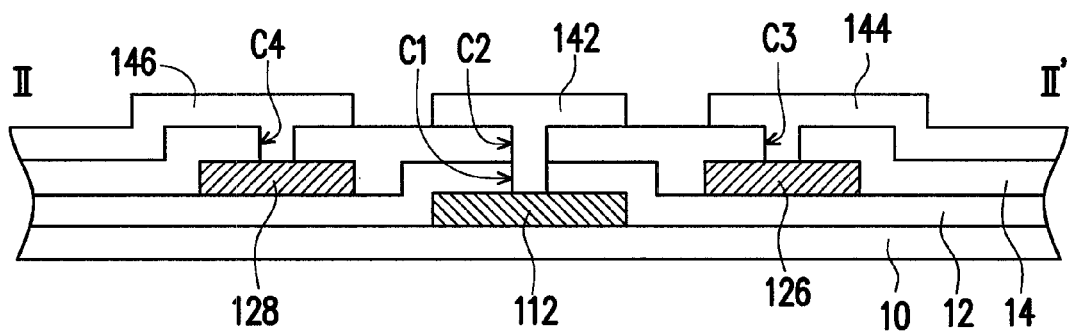
FIG. 1C is a cross-sectional view taken along a sectional line II-II' depicted in FIG. 1A.

FIG. 1C is a cross-sectional view taken along a sectional line II-II' depicted in FIG. 1A. Referring to FIGS. 1A, 1B, and 1C, the first insulator layer 12 in the present embodiment has a first gate contacting opening C1 to partially expose the scan line 112. The second insulator layer 14 has a second gate contacting opening C2, a first drain contacting opening C3, and a second drain contacting opening C4. The second gate contacting opening C2 is disposed aligned to the first gate contacting opening C1 such that the third gate 142 is electrically connected to the scan line 110 through the first gate contacting opening C1 and the second gate contacting opening C2. Moreover, the first drain contacting opening C3 partially expose the first drain 126 and the second drain contacting opening C4 partially expose the second drain 128. Therefore, the first pixel electrode 144 is electrically connected to the first drain 126 through the first drain contacting opening C3. Similarly, the second pixel electrode 146 is electrically connected to the second drain 128 through the second drain contacting opening C4.

The third gate 142 is electrically connected to the scan line 110 so that the third gate 142 has a voltage the same as the voltage of the first gate 116 and the second gate 118. Accordingly, the first active device TFT1 is a dual gates thin film transistor and the second active device TFT2 is a single gate thin film transistor. Under the disposition layout, the first active device TFT1 and the second active device TFT2 have different properties.

Figure 2A:
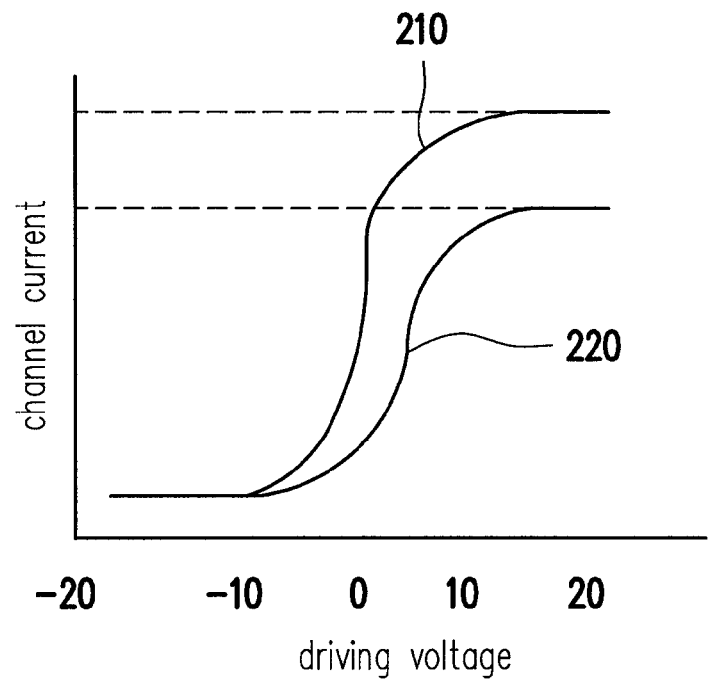
FIG. 2A shows relationships between the driving voltage and the channel current of the first active device and the second active device in the pixel structure according to an embodiment of the invention.
Figure 2B:
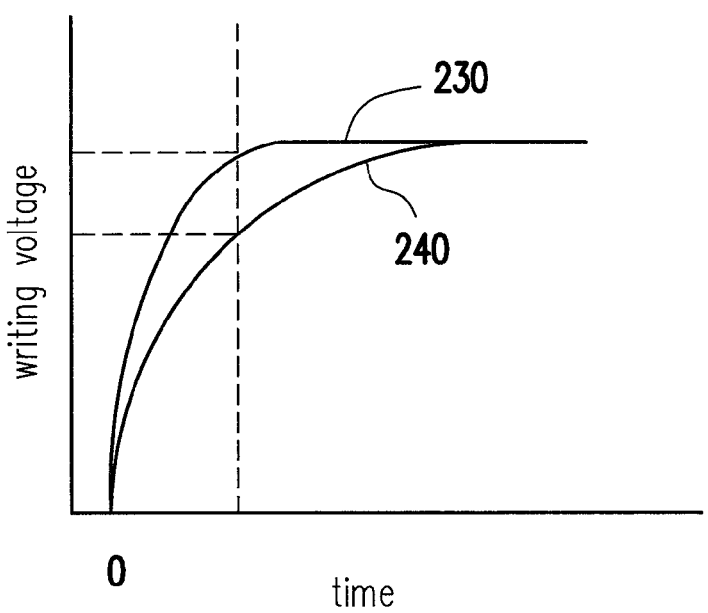
FIG. 2B shows relationships between the turn-on time and the writing voltages of the first active device and the second active device in the pixel structure according to an embodiment of the invention.

Specifically, FIG. 2A shows relationships between the driving voltage and the channel current of the first active device and the second active device in the pixel structure according to an embodiment of the invention and FIG. 2B shows relationships between the turn-on time and the writing voltages of the first active device and the second active device in the pixel structure according to an embodiment of the invention. Referring to FIGS. 1A, 1B, 2A, and 2B, the curve 210 shows a relationship between the driving voltage and the channel current of the first active device TFT1 and the curve 220 shows a relationship between the driving voltage and the channel current of the second active device TFT2. In addition, the curve 230 shows a relationship between the turn-on time and the writing voltages of the first active device TFT1 and the curve 240 shows a relationship between the turn-on time and the writing voltages of the second active device TFT2.

According to the curve 210 and the curve 220, under the same driving voltage, the first active device TFT1 having dual gates has higher channel current. Hence, in the relationship shown in the curve 230 and the curve 240, the second active device TFT 220 requires relative long time to completely write the predetermined voltage into the second pixel electrode 146. In other words, the writing efficiency of the first active device TFT1 is higher than that of the second active device TFT2. Based on the properties, the pixel structure 100 can make the first pixel electrode 144 and the second pixel electrode 146 be written by different voltages under the same driving signal through properly control the turn-on time. Therefore, when the pixel structure 100 of the invention is applied in an MVA-LCD, the problem of color shift is eliminated.

Specifically, the scan line 110 transmits a turn-on voltage to turn on the first active device TFT1 and the second active device TFT2 when the pixel structure 100 is driven. Meanwhile, a data voltage transmitted by the data line 122 can be written into the first pixel electrode 144 and the second pixel electrode 146 respectively through the first active device TFT1 and the second active device TFT2. Thereafter, the scan line 110 transmits a turn-off voltage to turn off the first active device TFT1 and the second active device TFT2 so that the writing action is terminated. Based on the relationships shown in FIG. 2B, the writing efficiency of the first active device TFT1 differs from that of the second active device TFT2. Therefore, the first pixel electrode 144 can be written in a higher voltage than that of the second pixel electrode 146 by properly controlling the turn-on time. When the pixel structure 100 is applied to an MVA-LCD, the liquid crystal molecules located above the first pixel electrode 144 are arranged in the alignment different than the liquid crystal molecules located above the second pixel electrode 146, thereby the problem of color shift is mitigated.

In summary, the pixel structure of the invention makes the first pixel electrode and the second pixel electrode be written in different voltages by using the disposition of the third gate to solve the problem of color shift in an MVA-LCD. Moreover, the third gate, the first pixel electrode, and the second pixel electrode are made by the same conductive layer without increasing the manufacturing process or the material cost. In addition, the disposition of the third gate would not decrease the aperture ratio of the pixel structure so that the pixel structure has quite good display quality.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A pixel structure, comprising:
a scan line having a mainline and a branch;

a semiconductor layer disposed on the mainline and the branch to respectively define a first gate and a second gate;

a data line intersected with the mainline;

a source directly connected to the data line, disposed on the semiconductor layer, and located between the first gate and the second gate;

a first drain contacting the semiconductor layer, and the first gate being located between the first drain and the source;

a second drain contacting the semiconductor layer, and the second gate being located between the second drain and the source;

a third gate, electrically connected to the scan line, wherein the third gate and the first gate are located between the source and the first drain and the second gate is located between the source and the second drain;

a first pixel electrode electrically connected to the first drain; and a second pixel electrode electrically connected to the second drain.

2. The pixel structure of claim 1, wherein the third gate, the first pixel electrode, and the second pixel electrode are made of a same material.

3. The pixel structure of claim 2, wherein the same material comprises a transparent conductive material.

4. The pixel structure of claim 1, further comprising a first insulator layer covering the scan line, wherein the first insulator layer has a first gate contacting opening to partially expose the scan line.

5. The pixel structure of claim 4, further comprising a second insulator layer covering the data line, the first drain, and the second drain, wherein the third gate, the first pixel electrode, and the second pixel electrode are disposed on the second insulator layer.

6. The pixel structure of claim 5, wherein the second insulator layer having:

a second gate contacting opening aligned to the first gate contacting opening, wherein the third gate is electrically connected to the scan line through the first gate contacting opening and the second gate contacting opening;

a first drain contacting opening partially exposing the first drain, wherein the first pixel electrode is electrically connected to the first drain through the first drain contacting opening; and a second drain contacting opening partially exposing the second drain, wherein the second pixel electrode is electrically connected to the second drain through the second drain contacting opening.

7. The pixel structure of claim 1, wherein the scan line has a protruding portion connected between the branch and the mainline, and the source is located between the protruding portion and the data line.

8. The pixel structure of claim 1, wherein the first gate, the third gate, the semiconductor layer, the source, and the first drain are provided to form a first active device.

9. The pixel structure of claim 1, wherein the second gate, the semiconductor layer, the source, and the second drain are provided to form a second active device.

* * * * *